US010241416B2

(12) United States Patent
Deguenther et al.

(10) Patent No.: US 10,241,416 B2
(45) Date of Patent: Mar. 26, 2019

(54) ILLUMINATION SYSTEM HAVING A BEAM DEFLECTION ARRAY FOR ILLUMINATING A MASK IN A MICROLITHOGRAPHIC PROJECTION EXPOSURE APPARATUS

(71) Applicant: Carl Zeiss SMT GmbH, Oberkochen (DE)

(72) Inventors: Markus Deguenther, Aalen (DE); Michael Layh, Altusried (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 921 days.

(21) Appl. No.: 14/657,320

(22) Filed: Mar. 13, 2015

(65) Prior Publication Data

US 2015/0185621 A1 Jul. 2, 2015

Related U.S. Application Data

(63) Continuation of application No. 12/711,059, filed on Feb. 23, 2010, now Pat. No. 9,007,563, which is a continuation of application No. PCT/EP2007/007576, filed on Aug. 30, 2007.

(51) Int. Cl.
*G03B 27/54* (2006.01)
*G03F 7/20* (2006.01)

(52) U.S. Cl.
CPC .......... *G03F 7/702* (2013.01); *G03F 7/70116* (2013.01)

(58) Field of Classification Search
CPC .............................. G03F 7/702; G03F 7/70116
See application file for complete search history.

(56) References Cited

U.S. PATENT DOCUMENTS

| 5,229,872 | A |   | 7/1993  | Mumola |
|-----------|---|---|---------|--------|
| 5,296,891 | A |   | 3/1994  | Vogt et al. |
| 5,523,193 | A |   | 6/1996  | Nelson |
| 5,691,541 | A | * | 11/1997 | Ceglio ................ G03F 7/70041 |
|           |   |   |         | 250/492.1 |
| 6,285,488 | B1 |  | 9/2001  | Sandstrom |
| 6,515,257 | B1 |  | 2/2003  | Jain et al. |

(Continued)

FOREIGN PATENT DOCUMENTS

| DE | 10 2004 019 346 A1 | 11/2005 |
|----|--------------------|---------|
| EP | 1 262 836          | 12/2002 |
| JP | 08 313842          | 11/1996 |
| JP | 2003-022967        | 1/2003  |

(Continued)

OTHER PUBLICATIONS

Japanese Office Action, with translation thereof, for corresponding JP Appl No. 2015-247053, dated Aug. 4, 2016.

(Continued)

*Primary Examiner* — Peter B Kim
(74) *Attorney, Agent, or Firm* — Fish & Richardson P.C.

(57) ABSTRACT

An illumination system for illuminating a mask in a scanning microlithographic projection exposure apparatus has an objective with an object plane, at least one pupil surface and an image plane in which a mask can be arranged. A beam deflection array of reflective or transparent beam deflection elements is provided, where each beam deflection element is adapted to deflect an impinging light ray by a deflection angle that is variable in response to a control signal. The beam deflection elements are arranged in or in close proximity to the object plane of the objective.

19 Claims, 12 Drawing Sheets

(56) References Cited

U.S. PATENT DOCUMENTS

| | | |
|---|---|---|
| 7,061,582 B2 | 6/2006 | Zinn et al. |
| 9,007,563 B2 | 4/2015 | Deguenther et al. |
| 2003/0030781 A1 | 2/2003 | Bleeker et al. |
| 2003/0038225 A1 | 2/2003 | Mulder et al. |
| 2003/0076404 A1 | 4/2003 | Taniguchi |
| 2006/0087634 A1 | 4/2006 | Brown et al. |
| 2006/0103908 A1 | 5/2006 | Loopstra et al. |
| 2007/0014112 A1* | 1/2007 | Ohya ............... G03F 7/70066 362/268 |
| 2007/0188729 A1 | 8/2007 | Mann et al. |
| 2007/0279535 A1 | 12/2007 | Fiolka |
| 2010/0157269 A1 | 6/2010 | Deguenther et al. |
| 2010/0195077 A1 | 8/2010 | Koehler et al. |
| 2011/0117503 A1* | 5/2011 | Uemura ............ G03F 7/70116 430/322 |

FOREIGN PATENT DOCUMENTS

| | | |
|---|---|---|
| JP | 2003-100626 | 4/2003 |
| JP | 2003-133201 | 5/2003 |
| JP | 2006-507672 | 3/2006 |
| JP | 2007-505488 | 3/2007 |
| JP | 2007-524248 | 8/2007 |
| WO | WO 2005/026843 | 3/2005 |
| WO | WO 2005/096098 | 10/2005 |
| WO | WO 2006/085626 A1 | 8/2006 |
| WO | WO 2007/093396 | 8/2007 |

OTHER PUBLICATIONS

The International Search Report for the corresponding PCT Application No. PCT/EP2007/007576, dated Sep. 1, 2008.

* cited by examiner

ILLUMINATION SYSTEM HAVING A BEAM DEFLECTION ARRAY FOR ILLUMINATING A MASK IN A MICROLITHOGRAPHIC PROJECTION EXPOSURE APPARATUS

CROSS-REFERENCE TO RELATED APPLICATION

This application is a continuation of, and claims benefit under 35 USC 120 to, U.S. application Ser. No. 12/711,059, filed Feb. 23, 2010, now U.S. Pat. No. 9,007,563, which is a continuation of, and claims benefit under 35 USC 120 to, international application PCT/EP2007/007576, filed Aug. 30, 2007. U.S. application Ser. No. 12/711,059 and international application PCT/EP2007/007576 are hereby incorporated by reference in their entirety.

FIELD

The disclosure generally relates to illumination systems for illuminating a mask in a microlithographic projection exposure apparatus. More particularly, the disclosure relates to such systems including an array of reflecting elements, which may be realized as a microelectro-mechanical system (MEMS).

BACKGROUND

Microlithography (also called photolithography or simply lithography) is a technology for the fabrication of integrated circuits, liquid crystal displays and other microstructured devices. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for a aligning the mask, a projection objective and a wafer alignment stage for aligning the wafer coated with the photoresist. The illumination system illuminates a field on the mask that may have the shape of an elongated rectangular slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam in a given reference direction while synchronously scanning the substrate table parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning device. Commonly used masks contain transparent or reflective patterns and may be of the binary, alternating phase-shift, attenuated phase-shift or various hybrid mask type, for example. However, there are also active masks, e.g. masks realized as a programmable mirror array. An example of such a device is a matrix-addressable surface having a viscoelastic control layer and a reflective surface. More information on such mirror arrays can be gleaned, for example, from U.S. Pat. Nos. 5,296,891, 5,523,193, 6,285,488 B1, 6,515,257 B1 and WO 2005/096098 A2. Also programmable LCD arrays may be used as active masks, as is described in U.S. Pat. No. 5,229,872. For the sake of simplicity, the rest of this text may specifically relate to apparatus including a mask and a mask stage. However, the general principles discussed in such apparatus should be seen in the broader context of the patterning device as hereabove set forth.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions along which the rays constituting the light bundle propagate. Frequently the angular distribution in the mask plane is simply referred to as illumination setting.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular distribution of the projection light, and thus all light rays impinge obliquely with similar angles onto the mask.

Different approaches are known in the art to modify the angular distribution of the projection light in the mask plane so as to achieve the desired illumination setting. In the simplest case an aperture stop (diaphragm) including one or more apertures is positioned in a pupil surface of the illumination system. Since locations in a pupil surface translate into angles in a Fourier related field plane such as the mask plane, the size, shape and location of the aperture(s) in the pupil surface determines the angular distributions in the mask plane. However, any change of the illumination setting involves a replacement of the stop. This can make it difficult to finally adjust the illumination setting, because this would involve a very large number of stops that have aperture(s) with slightly different sizes, shapes or locations. Apart from that, such a stop can absorb a very significant amount of light. This can reduce the throughput of the entire projection exposure apparatus.

Many common illumination systems therefore include adjustable elements that make it possible, at least to a certain extent, to continuously vary the illumination of the pupil surface. Conventionally, a zoom axicon system including a zoom objective and a pair of axicon elements are used for this purpose. An axicon element is a refractive lens that has a conical surface on one side and is usually plane on the opposite side. By providing a pair of such elements, one having a convex conical surface and the other a complementary concave conical surface, it is possible to radially shift light energy. The shift is a function of the distance between the axicon elements. The zoom objective makes it possible to alter the size of the illuminated area in the pupil surface.

However, with such a zoom axicon system only conventional and annular illumination settings can typically be produced. For other illumination settings, for example dipole or quadrupole illumination settings, additional stops or optical raster elements are often involved. An optical raster element produces, for each point on its surface, an angular distribution which corresponds in the far field to certain illuminated areas. Often such optical raster elements are realized as diffractive optical elements, and in particular as computer generated holograms (CGH). By positioning such an element in front of the pupil surface, optionally with an additional condenser lens in between, it is possible to produce almost any arbitrary intensity distribution in the pupil surface. An additional zoom-axicon system may be used to vary, to a limited extent, the illumination distribution produced by the optical raster element in the pupil surface.

However, the zoom axicon system typically provides only limited adjustability of the illumination setting. For example, it is generally not possible to dislocate only one of the four poles of a quadrupole illumination setting along an arbitrary direction. To this end another optical raster element often has to be used that is specifically designed for this particular intensity distribution in the pupil surface. The design, production and shipping of such optical raster elements can be a time consuming and costly process, and thus there is often little flexibility to adapt the light intensity distribution in the pupil surface to the needs of the operator of the projection exposure apparatus.

For increasing the flexibility in producing different angular distribution in the mask plane, it has been proposed to use mirror arrays that illuminate the pupil surface.

In EP 1 262 836 A1 such a mirror array is realized as a micro-electromechanical system (MEMS) including more than 1000 microscopic mirrors. Similar illumination systems are known from other patent documents, such as US 2006/0087634 A1 and U.S. Pat. No. 7,061,582 B2.

WO 2005/026843 A2 discloses an illumination system in which a diffractive optical element is arranged in the beam path between a mirror array and a pupil surface of the illumination system. An optical integrator such as a fly's eye lens or a quartz rod is arranged between the mirror array and the mask. The optical integrator ensures a homogenous illumination of the mask and also defines at least approximately the geometry of the illuminated field.

SUMMARY

In some embodiments, the disclosure provides an illumination system for illuminating a mask in a microlithographic projection exposure apparatus. The illumination system enables an operator of the projection exposure apparatus to set a wide variety of different illumination settings, but with a reduced system complexity.

In certain embodiments, the disclosure provides an illumination system including an objective having an object plane, at least one pupil surface and an image plane in which the mask can be arranged. The illumination system further includes a beam deflection array of reflective or transparent beam deflection elements. Each beam deflection element is adapted to deflect an impinging light ray by a deflection angle that is variable in response to a control signal. The beam deflection elements are arranged in or in close proximity to the object plane of the objective.

The beam deflection array "directly", i.e. without an intermediate optical integrator positioned in or in close proximity to a pupil surface, illuminates the mask. The angular distribution of light impinging on a particular point on the mask therefore depends mainly on the deflection angle by which an impinging light ray is deflected by the respective beam deflection element. Consequently, at a given time during the scanning operation, each point on the mask is illuminated only by light having a very restricted angular distribution. However, during the scan operation each point on the mask is illuminated by a plurality of different beam deflection elements that may produce a wide variety of different angular distributions. The resulting angular distribution after completion of the scanning operation is therefore obtained by integrating the angular distributions produced by the individual beam deflection elements. Thus, the illumination system makes it even possible to produce field dependent angular distributions, i.e. different points on the mask may be illuminated with different angular distributions.

The illumination system may have a very simple overall construction, because it involves, as indispensable components, only the objective that conjugates the beam deflection array with the mask plane.

A field defining raster element may be arranged between a light source of the illumination system and the beam deflection array. The field defining raster element produces a two dimensional far field intensity distribution which at least partially determines the shape of a field which is illuminated on the beam deflection array and thus, as a result of the optical conjugation between the plane of the beam deflection array and the mask plane, also on the mask. A condenser may be arranged between the field defining raster element and the beam deflection array so as to improve the system performance and reduce the overall length of the illumination system.

The angular distribution of the light impinging on the mask is determined by the deflection angles associated with each beam deflection element. In order to further increase the variability of manipulating the angular distribution, an additional pupil defining raster element arranged in a field plane, which is optically conjugated to the image plane of the objective, may be provided. This field plane may be the object plane of the objective, an intermediate image plane of the objective or a field plane which is ahead of the objective. In the latter case an additional optical system is involved that conjugates this field plane to the object plane of the objective.

The pupil defining raster element may include arrays of microlenses or diffractive structures. In the latter case it is even possible to form the pupil defining raster element directly on the surface of the beam deflection elements.

If a pupil defining raster element is used, the two-dimensional far field intensity distribution in the pupil surface of the objective is a convolution of the far field intensity distribution produced by the beam deflection array and the far field intensity distribution produced by the pupil defining raster element.

Each beam deflection element may be adapted to be either in an "on"-state or in an "off"-state, wherein the "on"-state is determined such that a deflected light beam passes the pupil surface. The "off"-state is determined such that a deflected light does not pass the pupil surface. With such a configuration of the beam deflection elements it is possible to adjust the illumination dose, i.e. the total light energy received by a particular point on the mask after completion of the scanning operation, by simply switching on and off one or more of the beam deflection elements that contribute to the illumination of that particular point on the mask.

In order to achieve sharp edges of the illuminated field of the mask along at least one direction, a field stop may be provided. The field stop may be arranged in or in immediate vicinity to the object plane or any other plane which is conjugated thereto, for example an intermediate image plane of the objective.

Because the beam deflection elements are inevitably separated by gaps, no light will impinge on the mask where images of these gaps are formed. Therefore measures have to be taken that ensure a uniform illumination of the mask. One measure is to stagger the beam deflection elements so that at least one beam deflection element is illuminated on any arbitrary line which extends parallel to the scan direction between opposite ends of the beam deflection array. It is then ensured that there are no points on the mask which do not receive any light at all during the scan operation. Ideally, the gaps are evenly distributed perpendicularly to the scan direction so that all points on the mask "see" the same number of gaps during the scanning operation.

Another measure is to use a field stop which has a stop edge that extends at least substantially along an X direction which is perpendicular to the scanning direction. The edge has indentations, wherein each indentation corresponds to a gap between adjacent beam deflection elements. The indentations increase the light dose impinging on the mask at the conjugated points and may thus compensate for the effect of the gaps. Such a field stop may be configured with a stop edge that is formed by a plurality of blades, wherein the shape and/or the position of at least some of the blades is adjustable with the help of a manipulator.

A still further measure to improve the illumination uniformity is to arrange the beam deflecting elements at a distance A with $|A|>A_{min}$ from the object plane, wherein $A_{min}$ is the shortest distance from the object plane at which a usable field in the object plane can be completely illuminated by the deflecting elements. On the other hand, the beam deflection elements should not be arranged to far away from the object plane. Optionally, $|A|<A_{max}$, wherein the distance $A_{max}$ is the shortest distance from the object plane at which two light bundles emerging from opposite edges of a deflection element intersect.

The beam deflection elements may be transparent elements that deflect light rays passing through the transparent elements. Such transparent elements may be realized as electro-optical or acousto-optical elements. Optionally, however, the deflection elements are mirrors that can be tilted relative to the object plane.

In order to reduce distortions that are caused by obliquely illuminating the beam deflection array, the object plane and the image may be inclined to each other. In this case the optical axis of the objective should be inclined both with respect to a normal on the object plane and to a normal on the image plane. This is, qualitatively speaking, the essence of what is usually referred to as Scheimpflug condition.

BRIEF DESCRIPTION OF THE DRAWINGS

Various features and advantages of the disclosure may be more readily understood with reference to the following detailed description taken in conjunction with the accompanying drawing in which.

DETAILED DESCRIPTION

1. General Structure of Projection Exposure Apparatus

Figure 1:
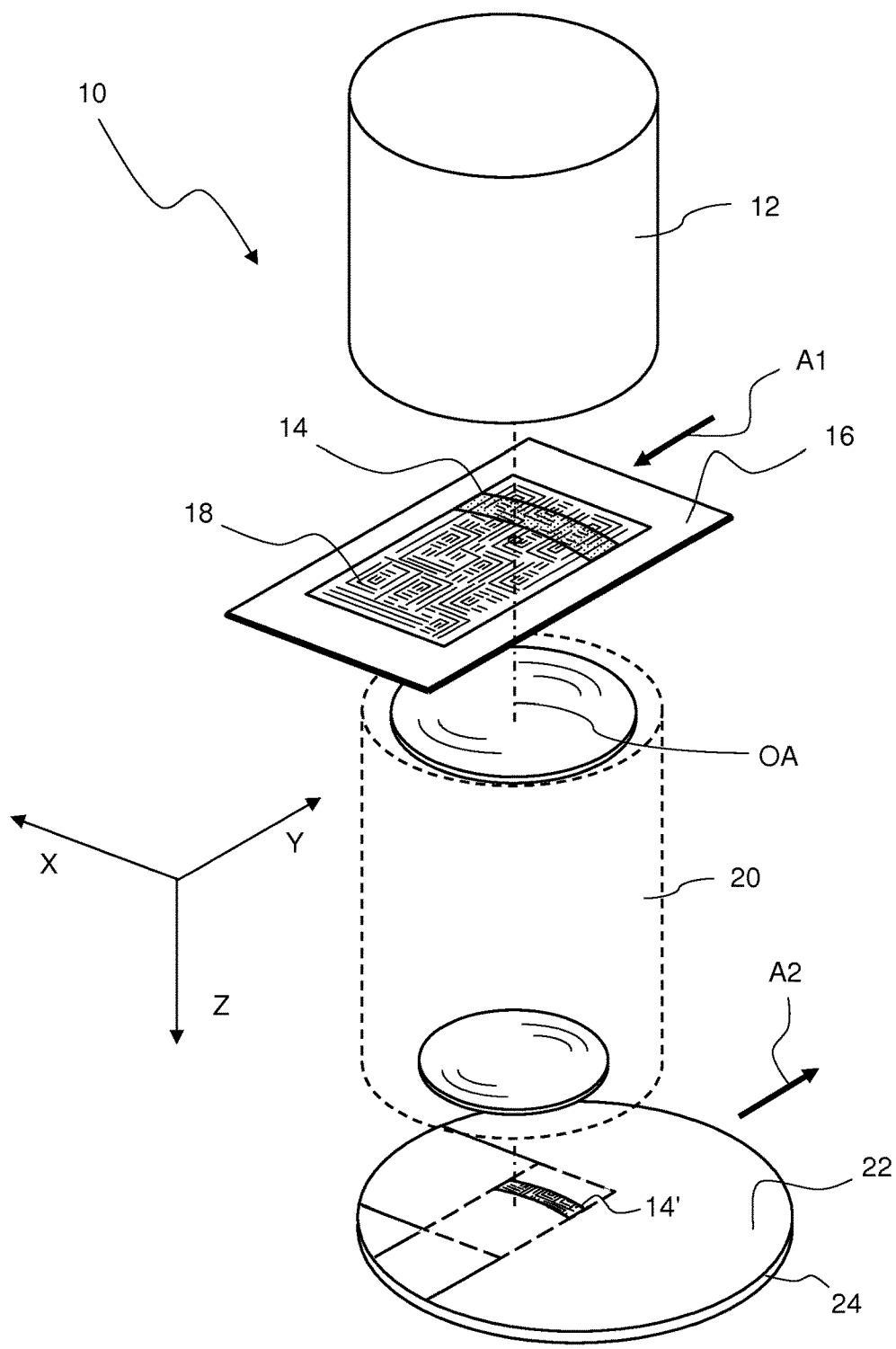
FIG. 1 is a perspective and considerably simplified view of a projection exposure apparatus.

FIG. 1 is a perspective and highly simplified view of a projection exposure apparatus 10 that used in the manufacture of integrated circuits and other microstructured components. The projection exposure apparatus includes an illumination system 12 containing a light source for the generation of projection light, and illumination optics that transforms the projection light into a projection light bundle having carefully defined properties. The projection light bundle illuminates a field 14 on a mask 16 containing minute structures 18. In this exemplary embodiment, the illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is applied on a substrate 24. The substrate 24, which may formed by a silicon wafer, is arranged on a wafer stage (not shown) such that a top surface of the light sensitive layer 22 is precisely located in the image plane of the projection objective 20. The mask 16 is positioned via a mask stage (not shown) in an object plane of the projection objective 20. Since the projection objective 20 has a magnification of less than 1, for example 1:4, a reduced image 14' of the structures 18 within the illuminated field 14 is formed on the light sensitive layer 22.

2. Illumination System

Figure 2:
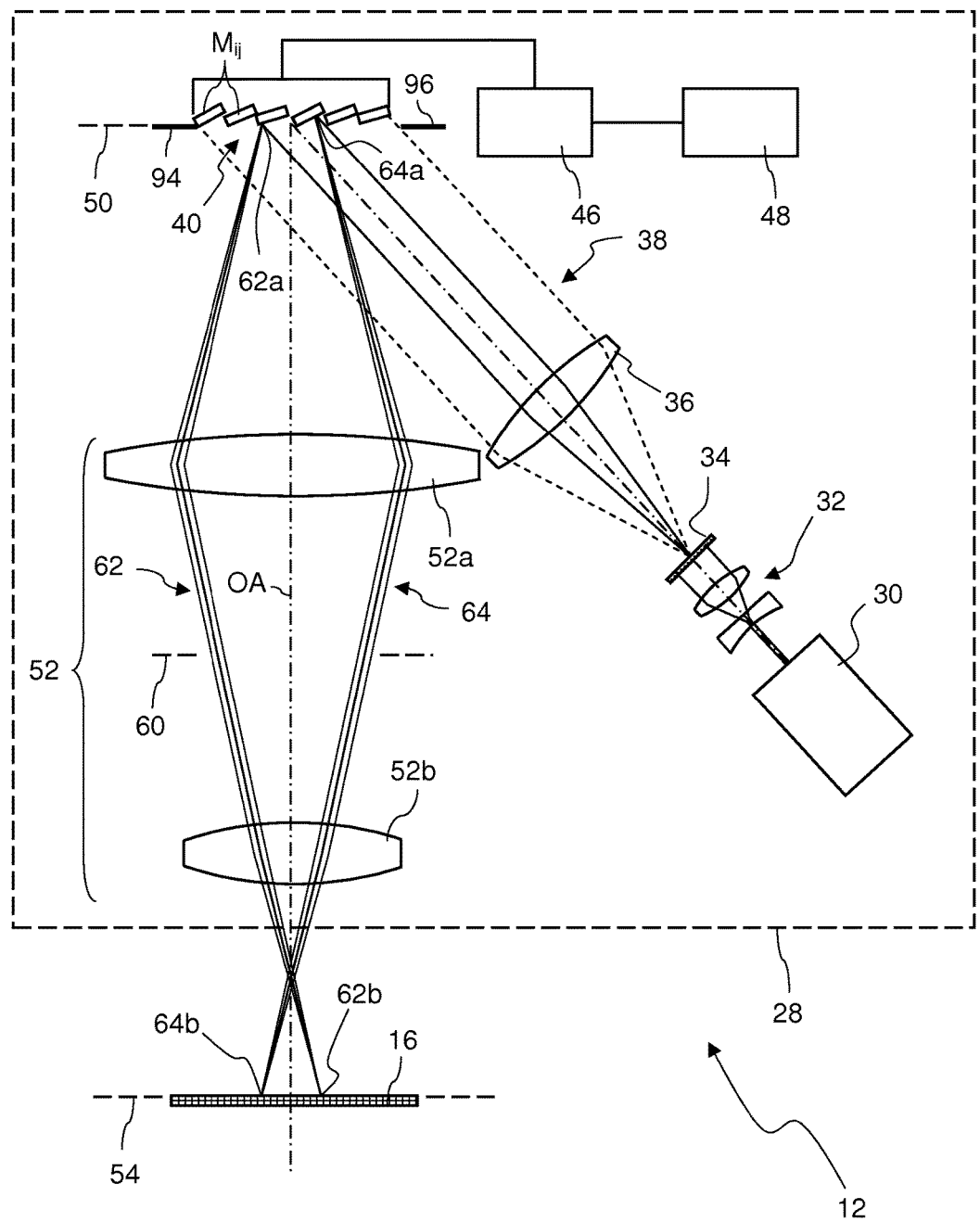
FIG. 2 is a meridional section through an illumination system contained in the projection exposure apparatus shown in FIG. 1.

FIG. 2 is a more detailed meridional section through an exemplary embodiment of the illumination system 12 shown in FIG. 1. For the sake of clarity, the illustration of FIG. 2 is considerably simplified and not to scale. This particularly implies that different optical units are represented by very few optical elements only. In reality, these units may include significantly more lenses and other optical elements.

The illumination system 12 includes a housing 28 and a light source that is, in the exemplary embodiment shown, realized as an excimer laser 30. The excimer laser 30 emits projection light that has a wavelength of about 193 nm. Other types of light sources and other wavelengths, for example 248 nm or 157 nm, are also contemplated.

In the exemplary embodiment shown, the projection light emitted by the excimer laser 30 enters a beam expansion unit 32 in which the light bundle is expanded without altering its geometrical optical flux. The beam expansion unit 32 may include several lenses as shown in FIG. 2, or may be realized as a mirror arrangement. After passing through the beam expansion unit 32, the projection light impinges on a field defining optical raster element 34.

The field defining optical raster element 34 may be configured as an optical integrator which produces a plurality of secondary light sources. Typically, such optical integrators include one or more microlens arrays that produce a well defined angular distribution if illuminated with a substantially collimated light beam. If the optical integrator includes at least two orthogonal arrays of cylindrical microlenses, it is possible to produce different angular distributions along the directions in which the microlenses extend. For further details reference is made to International application PCT/EP2007/001267 which is assigned to the applicant.

Alternatively, the field defining optical raster element 34 may be configured as a diffractive optical element (DOE), for example a computer generated hologram (CGH). Diffractive optical elements have the advantage that almost any arbitrary angular distribution, and thus almost any desired far field intensity distribution, may be generated.

Generally, the field defining optical raster element 34 may be embodied by any optical element that increases the geometrical optical flux. This means, more illustratively speaking, that any optical element is suitable that increases the divergence of any light bundle which impinges on an arbitrary surface area of the element.

The angular distribution produced by the field defining optical raster element 34 translates into a locally varying intensity distribution in the far field. In the far field the distance, at which an intensity distribution produced by an optical raster element is observed, is large in comparison to the typical width of the structures contained in the element. In the case of diffractive optical elements, the far field intensity distribution depends on the Fourier transform of a complex function which describes the impact of the diffracting structures contained in the diffractive optical element on the wavefront.

Mainly for reducing the longitudinal dimensions of the illumination system 12, a condenser lens 36 is arranged behind the field defining optical element 34. For the sake of simplicity, the condenser lens 36 is shown in FIG. 2 as a single lens. In real systems a lens system may be used instead that includes a plurality of individual lenses. The condenser lens 36 is arranged such that its front focal plane coincides with a plane in which the field defining optical element 34 is arranged.

The condenser lens 36 transforms the diverging light bundle emerging from the field defining optical element 34 into a substantially collimated beam 38 having a spatial intensity distribution which is determined by the field defining optical element 34. If the divergence introduced by the field defining optical element 34 is different in orthogonal directions X and Y perpendicular to an optical axis OA, the cross-section of the collimated beam 38 emerging from the condenser lens 36 may have the shape of a rectangular slit. The aspect ratio of the slit is determined by the divergence produced by the field defining optical element 34 along the X and Y directions.

Figure 3:
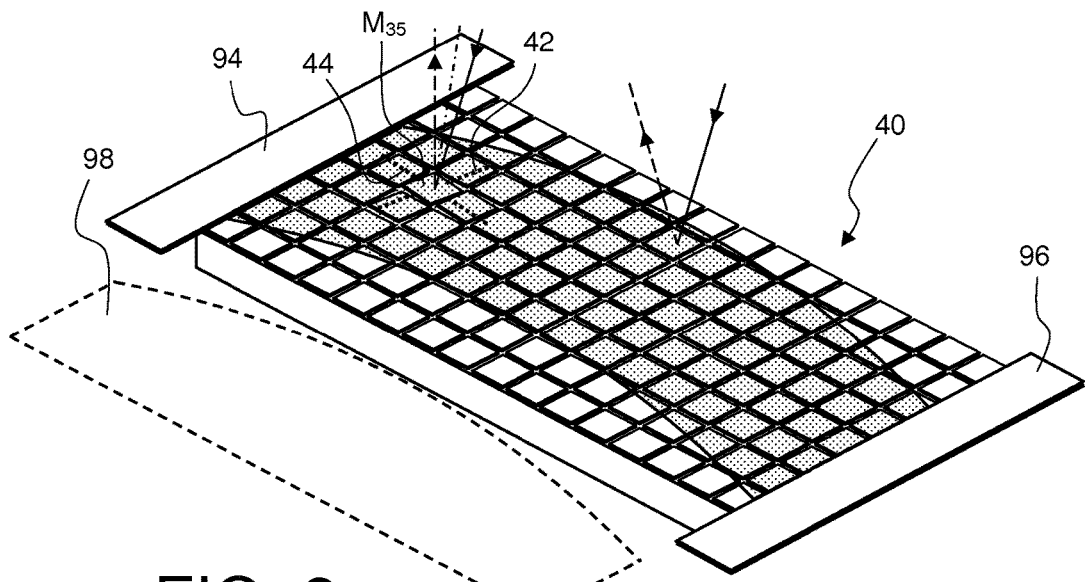
FIG. 3 is a perspective view of a mirror array contained in the illumination system of FIG. 2.

The collimated beam 38 impinges on a mirror array 40 which includes, in the exemplary embodiment shown, a plurality of rectangular mirror elements $M_{ij}$. FIG. 3, which is a perspective view of the mirror array 40, illustrates how the mirror elements $M_{ij}$ form a rectangular reflective surface which is only interrupted by narrow gaps between adjacent mirror elements $M_{ij}$. Each individual mirror element $M_{ij}$ can be tilted independently from each other by two tilt axes that can be aligned perpendicularly to each other. In FIG. 3 the tilt axes are indicated by broken lines 42, 44 for a single mirror element $M_{35}$. By tilting the individual mirror elements $M_{ij}$, it is possible to direct an impinging light ray into any arbitrary direction within a range of directions which is restricted by the tilting ranges of the mirror elements $M_{ij}$.

Figure 4:
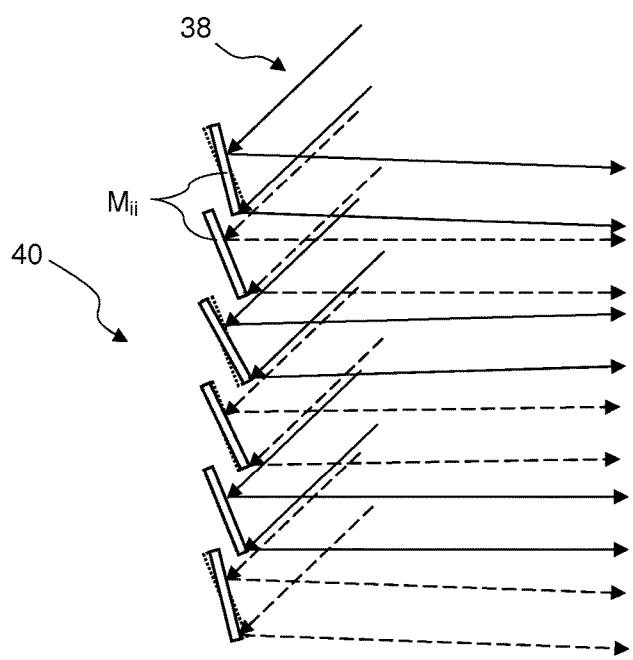
FIG. 4 is a cross-section through the mirror array of FIG. 3.

FIG. 4, which is a simplified side view of some of the mirror elements $M_{ij}$, illustrates how the collimated beam 38 is subdivided into a plurality of individual sub-beams by the mirror elements $M_{ij}$, wherein the sub-beams may be directed into various directions by tilting the mirror elements $M_{ij}$.

Two actuators (not shown) are connected to each individual mirror element $M_{ij}$ for tilting it around the two orthogonal tilting axes 42, 44. The actuators are connected to a control unit 46 which generates suitable control signals for the actuators. The control unit 46 therefore determines the tilting angles of the mirror elements $M_{ij}$, and thus also the angles by which the mirror elements $M_{ij}$ deflect impinging light rays. The control unit 46 is connected to an overall system control 48 that coordinates the various operations of the projection exposure apparatus 10.

The mirror array 40, or strictly speaking the reflective surfaces of the mirror elements $M_{ij}$, are arranged in or in close proximity to an object plane 50 of an objective 52, which includes, in the simplified illustration of FIG. 2, two lenses 52a and 52b. The objective 52, which may have one or more intermediate image planes as will discussed below with reference to FIG. 12, has an image plane 54 which is optically conjugated to the object plane 50. The image plane 54 coincides with a mask plane in which the mask 16 is positioned during the exposure operation. The objective 52 has at least one pupil plane 60 having a Fourier relationship with the adjacent field planes, here the optical plane 50 and the image plane 54.

Since the mirror array 40 is arranged in or in close proximity to the object plane 50 of the objective 52, an image of the mirror elements $M_{ij}$ is formed on the mask 16 in the image plane 54. Thus there is a one to one relationship between each point on a mirror element $M_{ij}$ and a conjugated point in the image plane 54. This conjugation is illustrated in FIG. 2 by slightly diverging light bundles 62, 64 which emerge from two points 62a, 64a on the mirror elements $M_{ij}$ and converge to conjugated image points 62b, 64b, respectively, located in the image plane 54.

Since the mirror elements on which the object points 62a, 64a are located, have different tilting angles, the light bundles 62, 64 intersect the pupil plane 60 at different locations. Consequently, the image points 62b, 64b on the mask 16 are illuminated with different angular distributions. In the configuration shown in FIG. 2, the light bundles 62, 64 illuminate the image points 62b, 64b obliquely from opposite directions.

For all object points on a particular mirror element $M_{ij}$ the same considerations apply correspondingly, at least as long as these object points are illuminated in exactly the same manner by the collimated beam 38. Thus all light reflected from a particular mirror element $M_{ij}$ intersects the pupil plane 62 at the same spot. This also means that, at a given time, the angular distributions for all image points of the particular mirror are substantially identical.

If all mirror elements $M_{ij}$ have identical tilt angles, slight deviations of the angular distributions may nevertheless be observed. This is because the collimated beam 38 illuminates the mirror array 40 obliquely, and thus the object points are not illuminated exactly in the same manner. To avoid such deviations, the field defining optical element 34 may be modified such that exactly the same illumination conditions prevail on all mirror elements $M_{ij}$.

Figure 5:
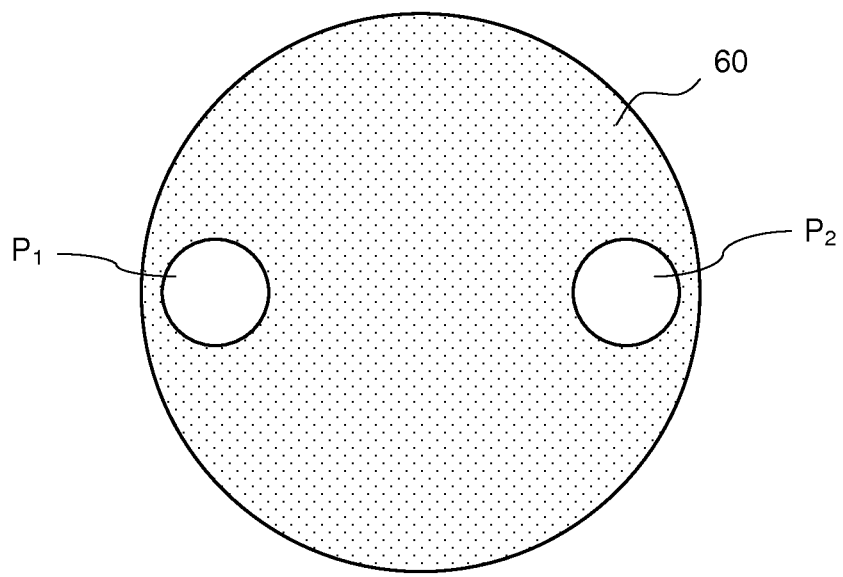
FIG. 5 is a top view on a pupil plane contained in the objective of the illumination system shown in FIG. 2.

In the configuration shown in FIG. 2 it is assumed that the mirror elements $M_{ij}$ are tilted such that all light bundles reflected from the mirror elements $M_{ij}$ pass through the same circular areas in the pupil plane 60, as it is shown in the schematic illustration of FIG. 5. The two areas, which are referred to in the following as poles $P_1$ and $P_2$, are arranged along the Y direction with mirror-symmetry with respect to the X-Z plane. Such an illumination of the pupil plane characterizes a dipole illumination setting, which is particularly useful for imaging structures that are aligned along the X direction. The diameter of the poles $P_1$, $P_2$ is determined by a residual divergence of the beam 38 which impinges on the mirror array 40. This residual divergence may be produced by the light source 30 and the field defining optical element 34.

For illuminating only the poles $P_1$ and $P_2$ in the pupil plane 60, each or at least some of the mirror elements $M_{ij}$ have to be individually controlled by the control unit 46. The control unit 46 ensures, for each mirror element $M_{ij}$, that the portion of the collimated beam 38 impinging the respective mirror element $M_{ij}$ is reflected such that it passes the poles $P_1$, $P_2$ in the pupil plane 60. Usually this will involve that all mirror elements $M_{ij}$ have different tilting angles. The control unit 46 may contain a look-up table in which, for a particular illumination setting, the tilting angles for all mirror elements $M_{ij}$ are stored. The selection of the illumination setting is usually performed manually at the system control 48, taking into account the specific configuration of the structures contained in the mask 16 to be projected.

It should be noted, however, that at a given time each particular image point on the mask 16 is illuminated only by the light bundle which emerges from the conjugated object point on one of the mirror elements $M_{ij}$ of the mirror array 40. In the case of a dipole illumination setting, this implies that, at a given time during the scan operation of the projection exposure apparatus 10, each point on the mask 16 is either illuminated by light passing through pole $P_1$ or by light passing through pole $P_2$.

As a result of the scanning operation, the mask 16 is moved through the illuminated field along the scan direction Y. Thus the exposure of a particular point on the mask 16 is obtained by integrating the contributions from all object points in the illuminated field along which the particular point on the mask 16 passes. If the point on the mask is illuminated from one side (pole $P_1$) through the first half of the scanning operation, and from the other side (pole $P_2$) during the other half of the scanning operation, for example, a dipole illumination is achieved in which the particular point on the mask is symmetrically illuminated from both sides after completion of the scanning operation.

Figure 6:
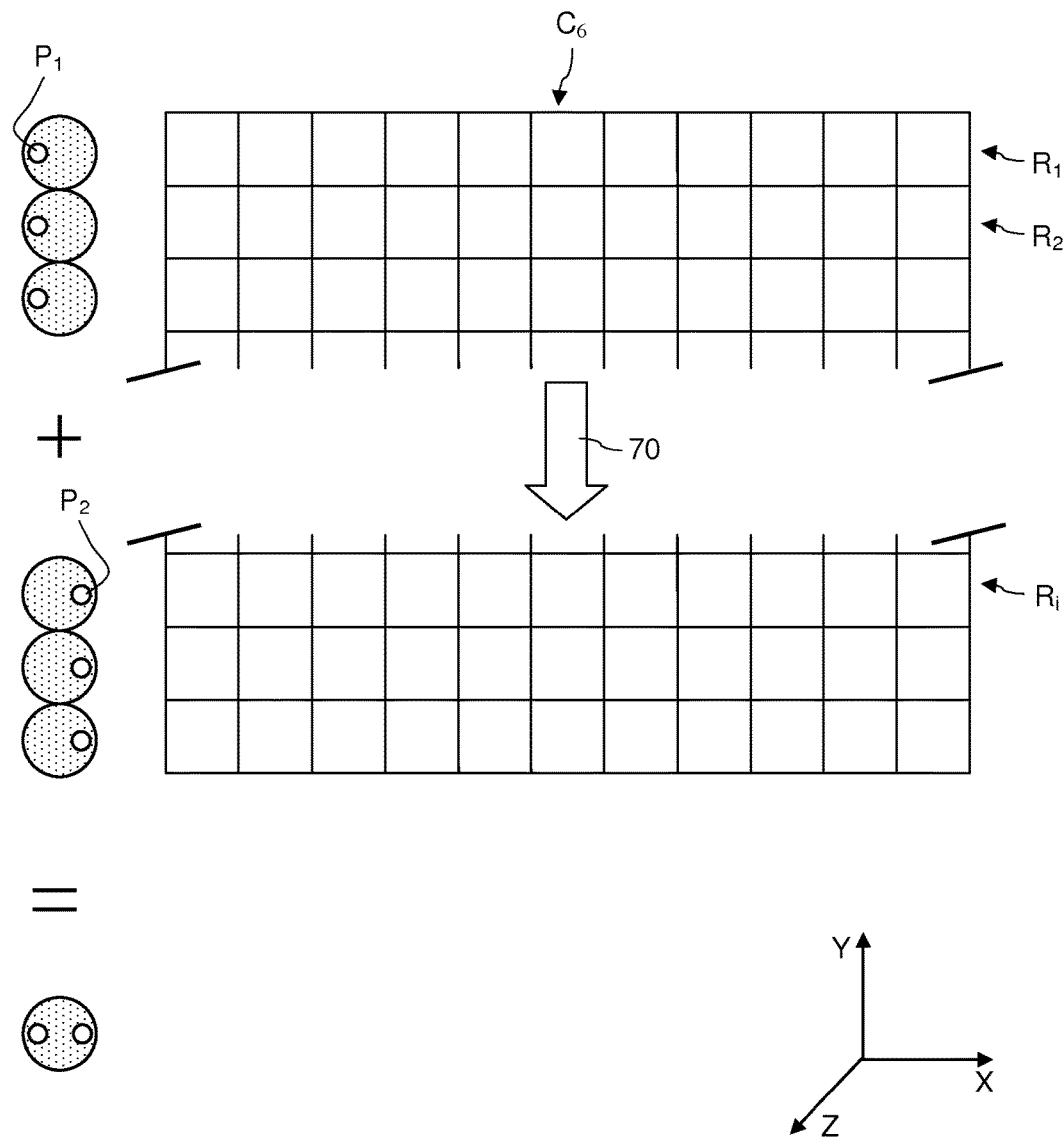
FIG. 6 is a schematic illustration of the mirror array (or of its image on the mask) for a dipole illumination setting.

This is illustrated in FIG. 6 which shows, in its top half, some rows $R_1$, $R_2$, . . . of the mirror array 40 in which the mirror elements $M_{ij}$ are tilted such that the reflected light passes through pole $P_1$. On the left of FIG. 6 the pupil plane 60 is schematically illustrated. In the bottom portion of FIG. 6, it is assumed that the mirror elements $M_{ij}$ of other rows $R_i$ are tilted such that the reflected light bundles all pass through the pole $P_2$.

Since the mirror array 40 is imaged by the objective 52 on the mask 16, the grid shown in FIG. 6 may also be considered to represent the image of the mirror array 40 in the image plane 54. Thus all points on the mask 16 positioned in the upper half of this grid are illuminated from one side (pole $P_1$) and all points positioned in the other half of the grid are illuminated from the opposite side (pole $P_2$) at a particular time during the scanning operation. If a point on the mask 16 moves through the illuminated field along the scanning direction Y, which is represented in FIG. 6 by an arrow 70, it is then first only illuminated by light which has passed through pole $P_1$, and then it is only illuminated by light which has passed through pole $P_2$. After completion of the scanning operation, the particular point on the mask 16 has been illuminated from both sides (poles $P_1$ and $P_2$), as it is indicated on the left below the "=" symbol.

From this description it becomes clear that the illumination system 12 makes it possible to vary almost continuously not only the total intensity, but also the total angular distribution of the light which any particular point on the mask 16 will receive after completion of a scanning operation. For example, if it is desired to illuminate the mask more from one side (pole $P_1$) than from the opposite side (pole $P_2$), then one or more of the rows $R_i$ of mirror elements $M_{ij}$ extending along the X direction may simply be switched to an off-state, in which the reflected light does not pass through the pupil plane 60 at all. Alternatively, the tilting angles of these mirror elements may be changed such that the reflected light passes not through the pole $P_1$, but also through the pole $P_2$.

It is even possible to obtain at different locations on the mask 16 different intensities and different angular distributions. In this case columns $C_j$ of the mirror elements $M_{ij}$ extending along the Y direction are controlled by the control unit 46 such that a different total intensity and/or a different angular distribution is obtained for all points on the mask which are illuminated by this column $C_j$ of mirror elements $M_{ij}$.

For example, individual mirror elements $M_{ij}$ of this column may be brought into an off-state, or other areas in the pupil plane 60 may be illuminated by one or more of the mirror elements $M_{ij}$ of this column. It may even be considered to continuously or suddenly change the tilting angles of mirror elements contained in a particular column $C_j$ so that points on the mask 16 illuminated by this particular column receive a different angular distribution.

Figure 7:
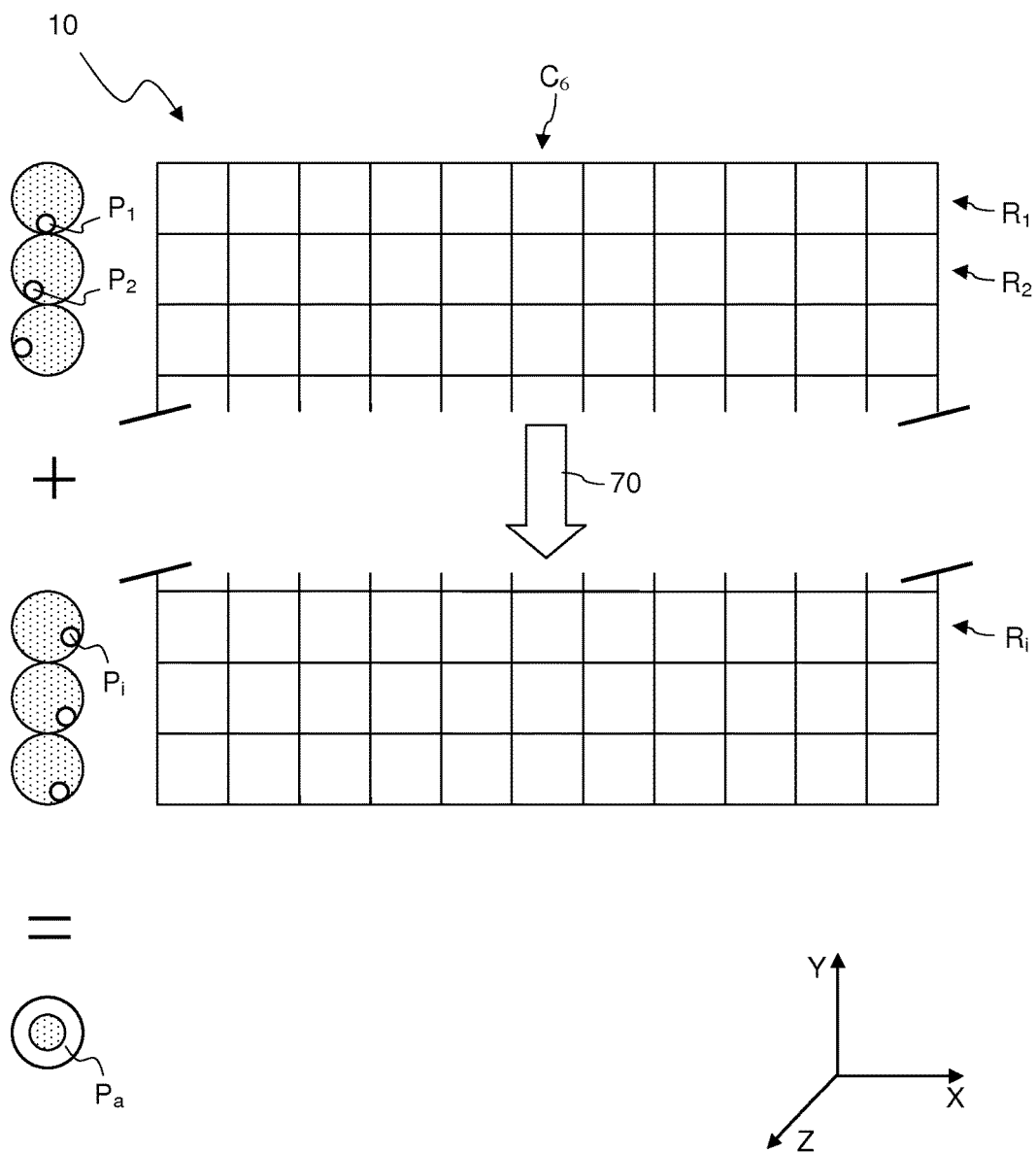
FIG. 7 is an illustration similar to FIG. 6, but for an annular illumination setting.

From the foregoing it should also have become clear that it is possible to obtain almost any arbitrary angular distribution of the projection light on the mask 16. FIG. 7 shows, in a representation similar to FIG. 6, a configuration of the mirror elements $M_{ij}$ that are tilted such that an annular illumination setting is accomplished. More specifically, each row $R_i$ of the mirror array 40 reflects the impinging light such that it passes through a particular area in the pupil plane 60 which is indicated on the left-hand side by $P_i$. The areas $P_i$, which may partially overlap, combine so as to form an approximately annular pattern $P_a$, as it is shown in the lower left corner of FIG. 7 below the "=" symbol.

If a point on the mask 16 is illuminated consecutively by the mirror elements of a particular column $C_j$, it will subsequently be exposed to projection light which impinges obliquely, but from different solid angles, on the point during the scanning operation. After the scanning operation is completed, the point will have been exposed to projection light from all directions which are associated with the annular area $P_a$ as shown in the left bottom portion of FIG. 7.

Again, the angular distribution may be modified by tilting individual mirrors $M_{ij}$ of the mirror array 40. Apart from this, it is possible to accomplish an annular illumination setting for points on the mask illuminated by one or more columns $C_j$ in the manner described above and to accomplish a different illumination setting, for example a dipole or quadrupole illumination setting, for other points on the mask which are illuminated by mirror elements $M_{ij}$ of different columns $C_{j'}$.

The possibility to illuminate different points on the mask 16 with different angular distributions may be used to improve the imaging of different structures on the mask 16. Another application is the compensation of field dependent disturbances of the angular distribution produced by other components of the illumination system 12. In the latter case the goal is to achieve the same angular distribution for all points on the mask 16 although certain optical components may have an adverse effect on this homogeneity.

3. Alternative Embodiments

It should be well understood that various alternative embodiments are presently contemplated that are still within the scope of the present disclosure.

3.1 Scheimpflug Arrangement

Figure 8:
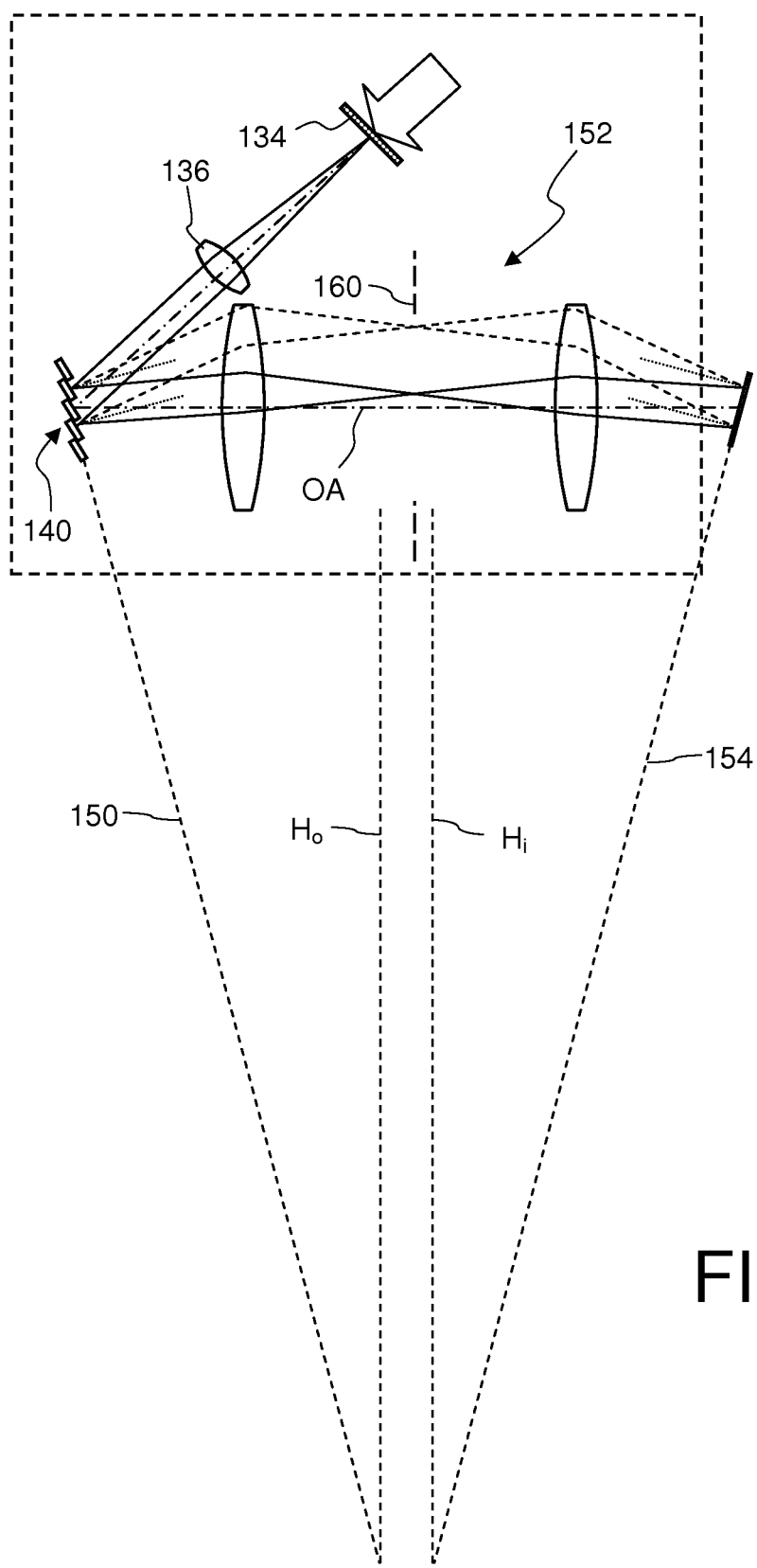
FIG. 8 is a simplified meridional section through an illumination system according to another exemplary embodiment, in which the object plane and the image plane of the objective are not parallel.

FIG. 8 shows an exemplary alternative embodiment in a still further simplified representation similar to FIG. 2. In FIG. 8 components corresponding to those shown in FIG. 2 are denoted by the same reference numerals augmented by 100; most of these components will not be explained in detail again.

In the exemplary embodiment shown in FIG. 8 the object plane 150 and the image plane 154 of the objective 152 are not parallel, but inclined to each other. For forming a sharp image of the inclined object plane 150 on the image plane 154, it is desirable to arrange the objective 152 such that its optical axis OA forms an angle both with the normal on the object plane 150 and the normal on the image plane 154.

Such a configuration is in accordance with what is usually referred to as Scheimpflug condition. This condition involves the object plane and an object side principal plane of the objective indicated by $H_o$ in FIG. 8 being at least approximately intersect along a straight line. The same should apply to an image side principal plane $H_i$ and the image plane 154. If the Scheimpflug condition prevails, the inclined object plane 150 is sharply imaged on the image plane 154. The image of the mirror array 140 will be distorted in the image plane 154, but this distortion does not have a detrimental effect on either the intensity or the angular distribution of the light impinging on the mask 16.

The fulfillment of the Scheimpflug condition has the advantage that the angle between the object plane 50, in which the mirror array 40 is arranged, and the optical axis of the condenser lens 36 becomes smaller. This reduces distortions of the illumination of the mirror array 40 by the collimated beam 38.

3.2 Gaps Between Mirror Elements

Figure 9:
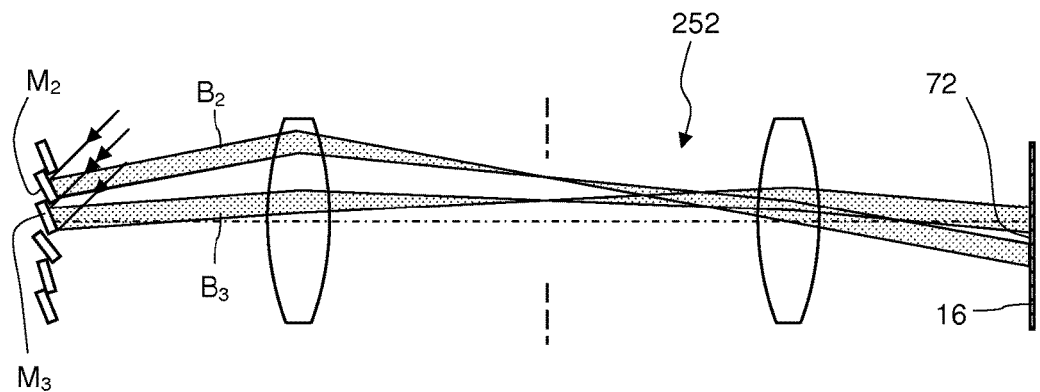
FIG. 9 is a meridional section through an objective of the illumination system that illustrates the imaging of the gaps formed between adjacent mirror elements on the mask.

If the mirror elements $M_{ij}$ are arranged exactly in the object plane 50 of the objective 52, inevitable gaps between adjacent mirror elements $M_{ij}$ will be sharply imaged on the mask 16. This is illustrated in the schematic meridional section of FIG. 9 which shows two light bundles $B_2$ and $B_3$ that are reflected from mirror elements $M_2$ and $M_3$, respectively, and impinge on the mask 16. As can be clearly seen in FIG. 9, the gap between the adjacent mirror elements $M_2$, $M_3$ is imaged on the mask 16 at 72. The width of the gap image depends on the magnification of the objective 52.

If such gaps 72 extend perpendicularly to the scan direction Y, they are of little concern because of the integrating effect achieved with the scanning operation. However, gaps 72 extending parallel to the scan direction Y (here referred to as Y-gaps) may result in an inhomogeneous illumination of the mask 16, which will finally translate into undesired structure size variations on the wafer 24.

One solution for this problem is to ensure that the Y-gaps do not line up along the scan direction Y, but are more or less evenly distributed over the illuminated field along the X direction.

If the Y-gaps are not evenly distributed along the X direction, there will be a plurality of stripes extending along the Y direction and receiving less light energy in the absence of other compensation measures. However, upon application of suitable compensation measures, a homogenous energy distribution during the scan operation may nevertheless be accomplished. Such compensation measures may involve, for example, the reduction of the intensity in the remaining areas between these stripes. To this end individual mirror elements $M_{ij}$ may be brought into an off-state.

Figure 10:
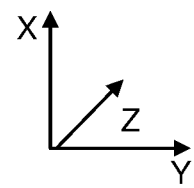
FIG. 10 is a schematic top view on an adjustable field stop.
Figure 10:
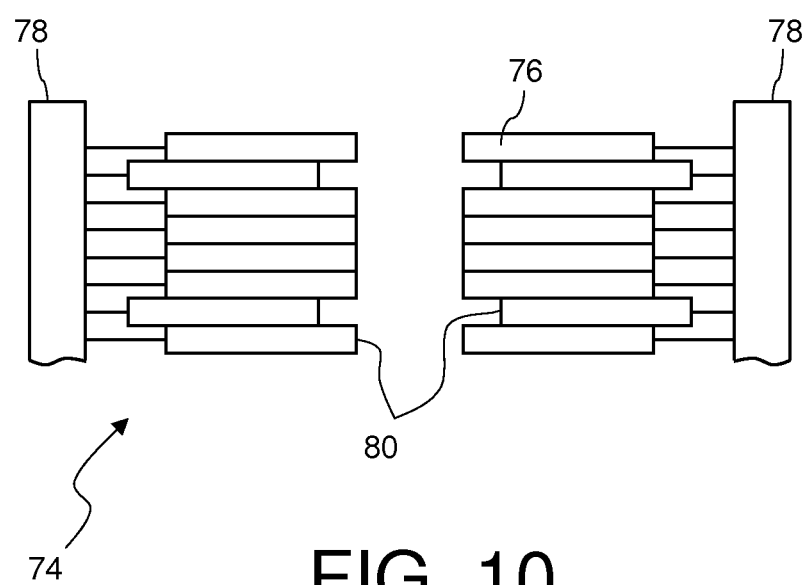

Another approach to reduce the intensity in the remaining areas between the stripes is to arrange a special field stop in the object plane 50, the image plane 54 or an intermediate image plane. FIG. 10 shows, in a simplified top view, a suitable field stop device 74 which includes a plurality of adjacent blades 76 which can be moved along the Y direction with the help of actuators 78. The short edges 80 of the blades 76 determine the size of the illuminated field along the Y direction. These short edges 80 combine to form the two long sides of the rectangular slit. At positions where the short edges 80 are retracted, these long sides have indentations. The indentations, where the distances between opposite blades 76 are larger, correspond to positions where Y-gap images are. This ensures the desired compensation.

Another approach to avoid dark stripes extending along the scan direction Y is to arrange the mirror elements $M_{ij}$ slightly outside the object plane 50. This exploits the face that the light bundles reflected from the mirror elements $M_{ij}$ have at least a small divergence. For example, if the mirror elements $M_{ij}$ are arranged behind the object plane 50, it seems as if the reflected light would emerge from a completely bright object plane 50. If the mirror elements $M_{ij}$ are arranged in front of the object plane 50, the diverging light beams overlap in the object plane 50 such that the latter is completely illuminated.

Figure 11:
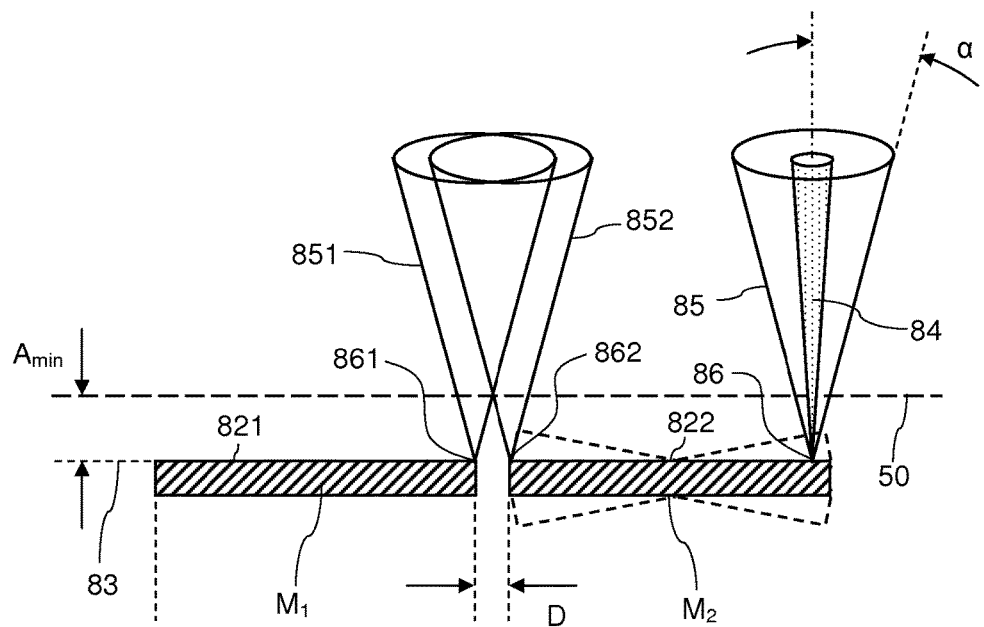
FIG. 11 shows two mirror elements in a cross section that are arranged outside an object plane of an objective.

The latter case is illustrated in FIG. 11 which shows two mirror elements $M_1$, $M_2$ in a cross section. It is, for the sake of simplicity, assumed that reflecting surfaces 821, 822 are (at least approximately) arranged in a plane 83 which is separated from the object plane 50 of the objective 52 by a distance $A_{min}$. The width of the gap between the two adjacent mirror elements $M_1$, $M_2$ is denoted by D.

A reflected diverging light bundle is illustrated in FIG. 11 by a cone 84. If the mirror elements $M_1$, $M_2$ are tilted, as it is indicated for the mirror element $M_2$ by broken lines, the reflected light bundle 84 changes its direction but will still, due to the limited maximum tilting angles, remain within a cone or solid angle 85 having an aperture angle α. Thus light rays emerging from a point 86 on the mirror surface 822 may pass along any line within the cone 85.

In the centre of FIG. 11 two cones 851, 852 are indicated that are associated with two points 861, 862 on the adjacent edges of the mirror elements $M_1$ and $M_2$, respectively. At the minimum distance $A_{min}$ from the plane 83 light rays emerging from the points 861, 862 may intersect so that there is no area in the object plane 50 in the vicinity of the gap that is not illuminated. Optionally, the distance A between the object plane 50 and the plane 83 of the mirror surfaces 821, 822 should exceed $A_{min}$ so as to ensure that for all tilting angles the object plane 50 is completely illuminated by the diverging bundles 84.

For small cone angles α the minimum distance $A_{min}$ may be determined from the width D of the gap and the angle α by $$A_{min} > D/\alpha.$$

On the other hand, the distance between the plane 83 of the reflecting surfaces 821, 822 and the object plane 50 should not be exceedingly large. If the mirror array 40 is positioned too far away from the object plane 50, the directions of the reflected light bundles are not properly transformed into the desired angular distribution on the mask 16.

Figure 12:
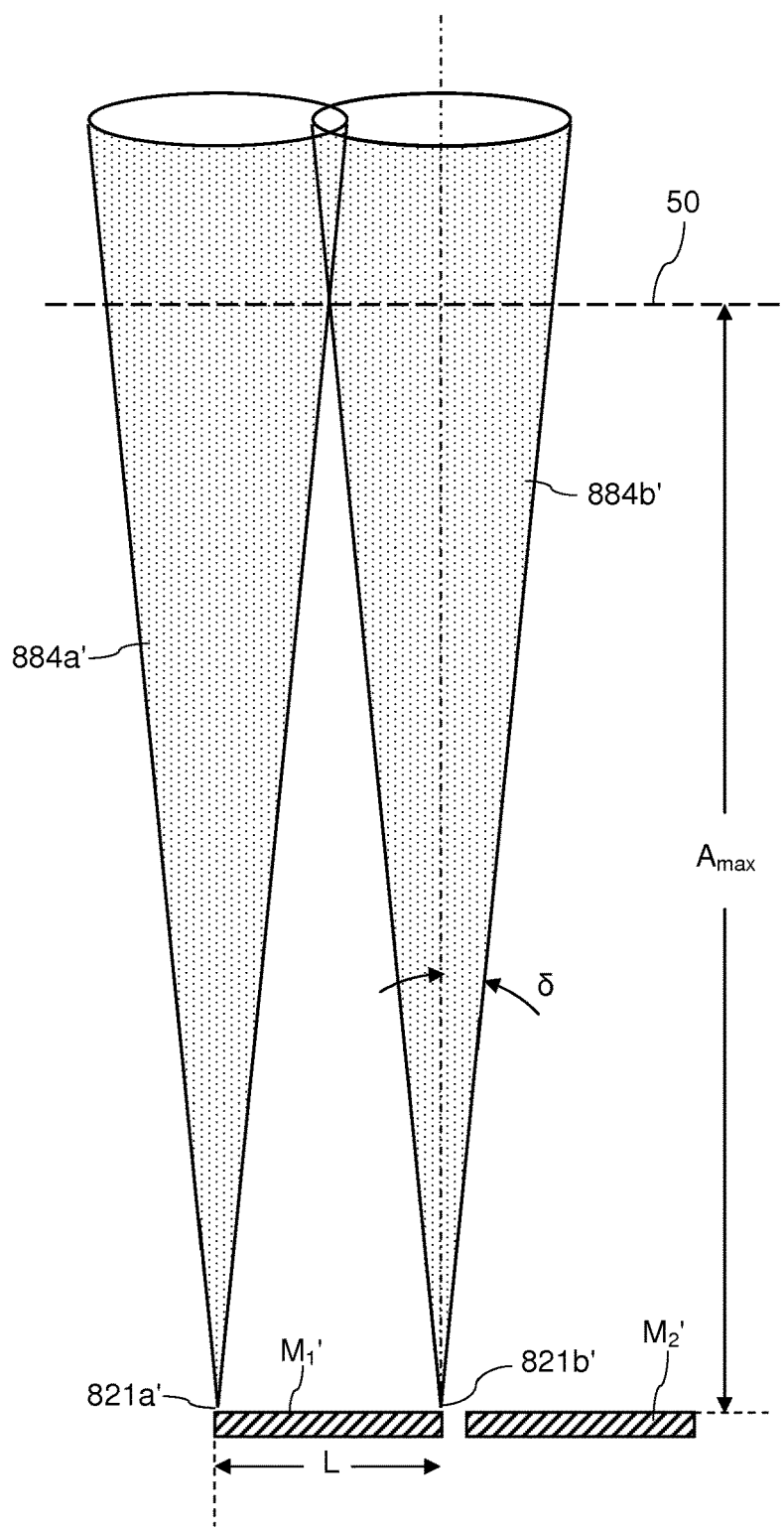
FIG. 12 is an illustration similar to FIG. 11, but with a larger distance between the object plane of the objective and the mirror elements.

A useful upper limit for the distance A may be that light bundles emerging from a single mirror element $M_{ij}$ do not intersect in the object plane 50. This is illustrated in FIG. 12, which shows two mirror elements $M_1'$ and $M_2'$ of width L. The aperture angle of the light bundles emerging from points 821a', 821b' on opposite edges of the mirror element $M_1'$ is denoted by δ. At a distance $A_{max}$ the light bundles 884a', 884b' intersect. The distance $A_{max}$ may be determined from the width L and the aperture angle δ by $$A_{max} < L/\delta.$$

3.3 Field Stop

In the exemplary embodiment shown in FIGS. 1 to 7 it has been assumed that the illuminated field 14 on the mask 16 has approximately the shape of a ring segment. Such a geometry may be achieved, for example, by a field defining optical element 34 which is configured as a suitable diffractive optical element. However, it is difficult to achieve sharp edges in the far field. In the illuminated field 14, at least the edges extending along the scan direction Y usually have to be sharp.

For achieving sharp edges at least along the scan direction Y, field stop elements 94, 96 (see FIGS. 2 and 3) may be used that cover those portions of the mirror array 40 which shall not be imaged on the mask 16. If also the edges extending perpendicularly to the scan direction Y shall be imaged sharply on the mask 16, additional field stop elements may be provided. In FIG. 3 such an additional field stop element is indicated in broken lines and denoted by 98. Also a more complex field stop device 74 as shown in FIG. 10 may be positioned in the object plane 50 of the objective 52. This particularly holds true if the mirror array 40 is positioned at a distance A from the object plane 50 as has been explained above with reference to FIGS. 11 and 12.

Figure 13:
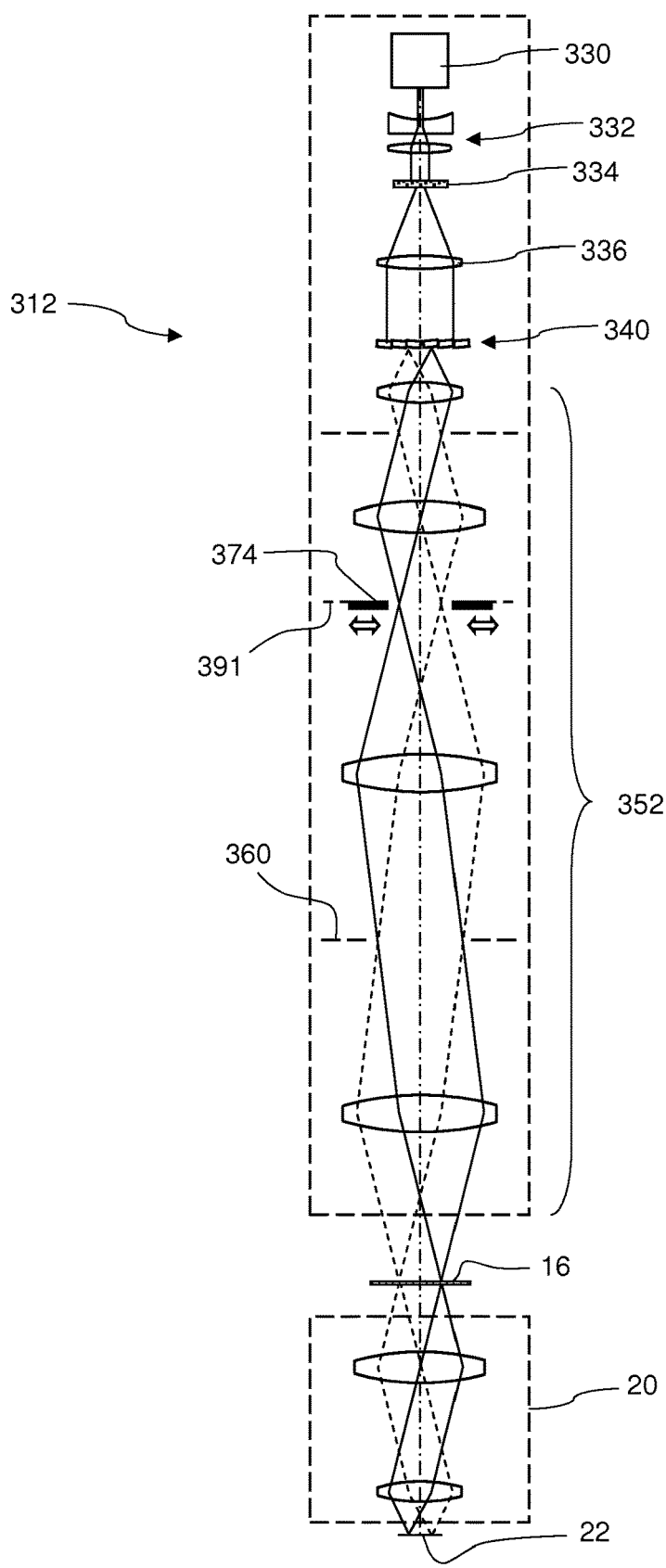
FIG. 13 is a meridional section through an illumination system according to a further exemplary embodiment of the disclosure in which a field stop is arranged in an intermediate image plane.

FIG. 13 shows, in a meridional section similar to FIG. 2, an exemplary alternative embodiment of an illumination system. Components corresponding to those shown in FIG. 2 are denoted by the same reference numerals augmented by 300; most of these components will not be explained again.

In the illumination system 312 the objective 352 has an intermediate image plane 391 in which a field stop 374 is arranged. The field stop 374 may be of the adjustable type as has been explained above with reference to FIG. 10. The additional intermediate image plane 391 provides more freedom to install in the illumination system 312 also bulkier field stop devices.

3.4 Transparent Deflecting Elements

Figure 14:
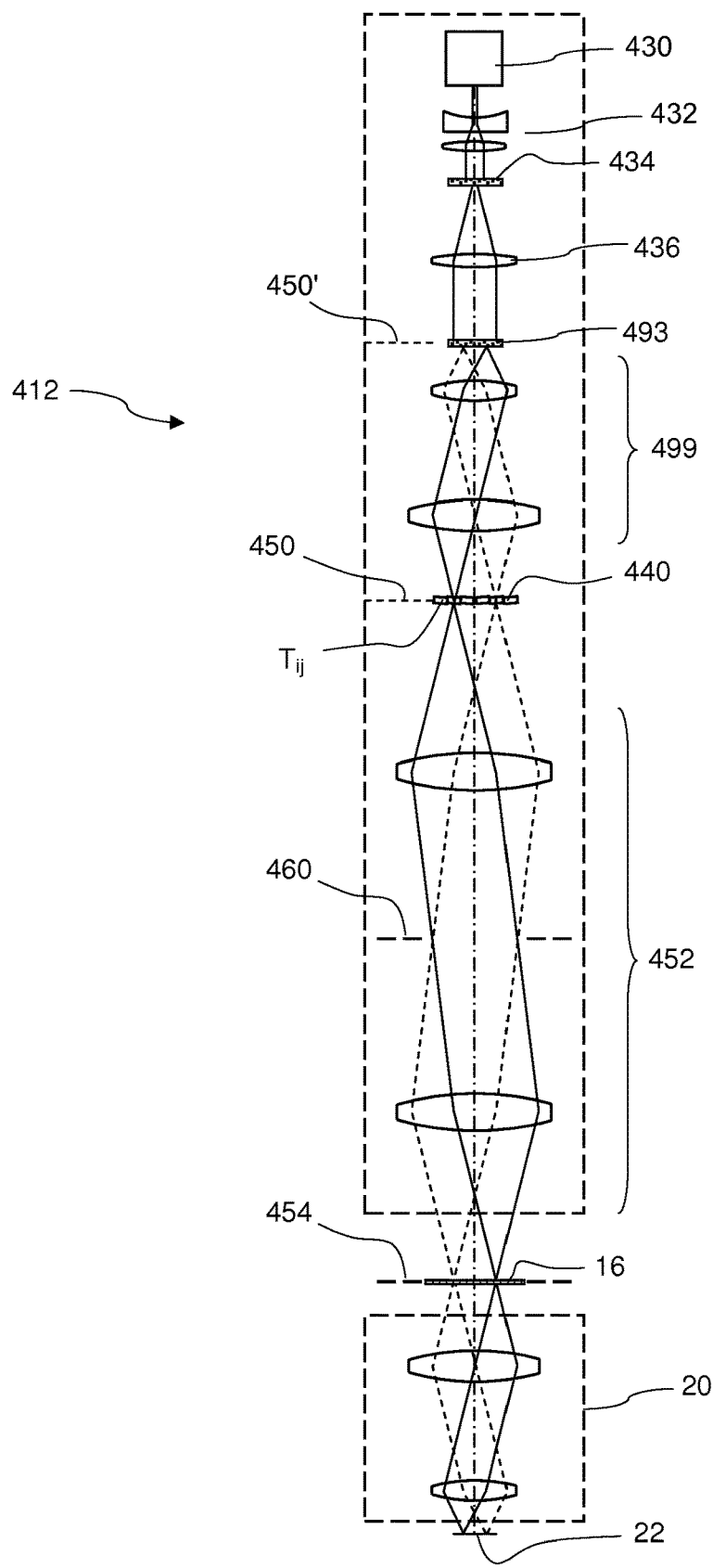
FIG. 14 is a meridional section through an illumination system according to still another exemplary embodiment in which an additional pupil defining element is provided.

FIG. 14 shows, in a meridional section similar to FIG. 2, another exemplary alternative embodiment of an illumination system. Components corresponding to those shown in FIG. 2 are denoted by the same reference numerals augmented by 400; most of these components will not be explained again.

The illumination system 412 differs from the illumination system 12 shown in FIG. 2 mainly in two respects:

Firstly, the mirror array 40 is replaced by a refractive array 440 including a plurality of transparent refractive elements $T_{ij}$. These refractive elements $T_{ij}$ may be configured as electro-optical or acousto-optical elements, for example. In such elements the refractive index can be varied by exposing a suitable material to ultrasonic waves or electric fields, respectively. These effects can be exploited to produce index gratings that deflect impinging light to various directions. The directions can be altered in response to a suitable control signal.

3.5 Additional Pupil Defining Element

Another difference is that the field defining optical element 434 does not directly illuminate the refractive array 440, but through a pupil defining optical element 493 which is positioned in a plane 450' being optically conjugate with the object plane 450 via an objective 499. The pupil defining optical element 493, which may be configured as an optical raster element such as a microlens array or a diffractive optical element, produces an angular distribution which is imaged on the refractive array 440 via the objective 499. As a result, the direction of the light rays emerging from the refractive elements $T_{ij}$ does not only depend on the deflection angle produced by the individual refractive elements $T_{ij}$, but also by the angular distribution produced by the pupil defining element 493. The pupil defining element may include zones associated with individual refractive elements $T_{ij}$ wherein the zones produce different far field intensity distributions. This may be used to impart a common or different fixed offset angles on certain transmission elements $T_{ij}$, for example. Such an offset angle may be particularly useful if mirror elements are used instead of refractive elements $T_{ij}$.

The intensity distribution in the pupil plane 460 of the objective 452 may then be described as a convolution of the far field intensity distributions produced by the pupil defining element 493 and the far field intensity distribution produced by the refractive array 440.

Figure 15:
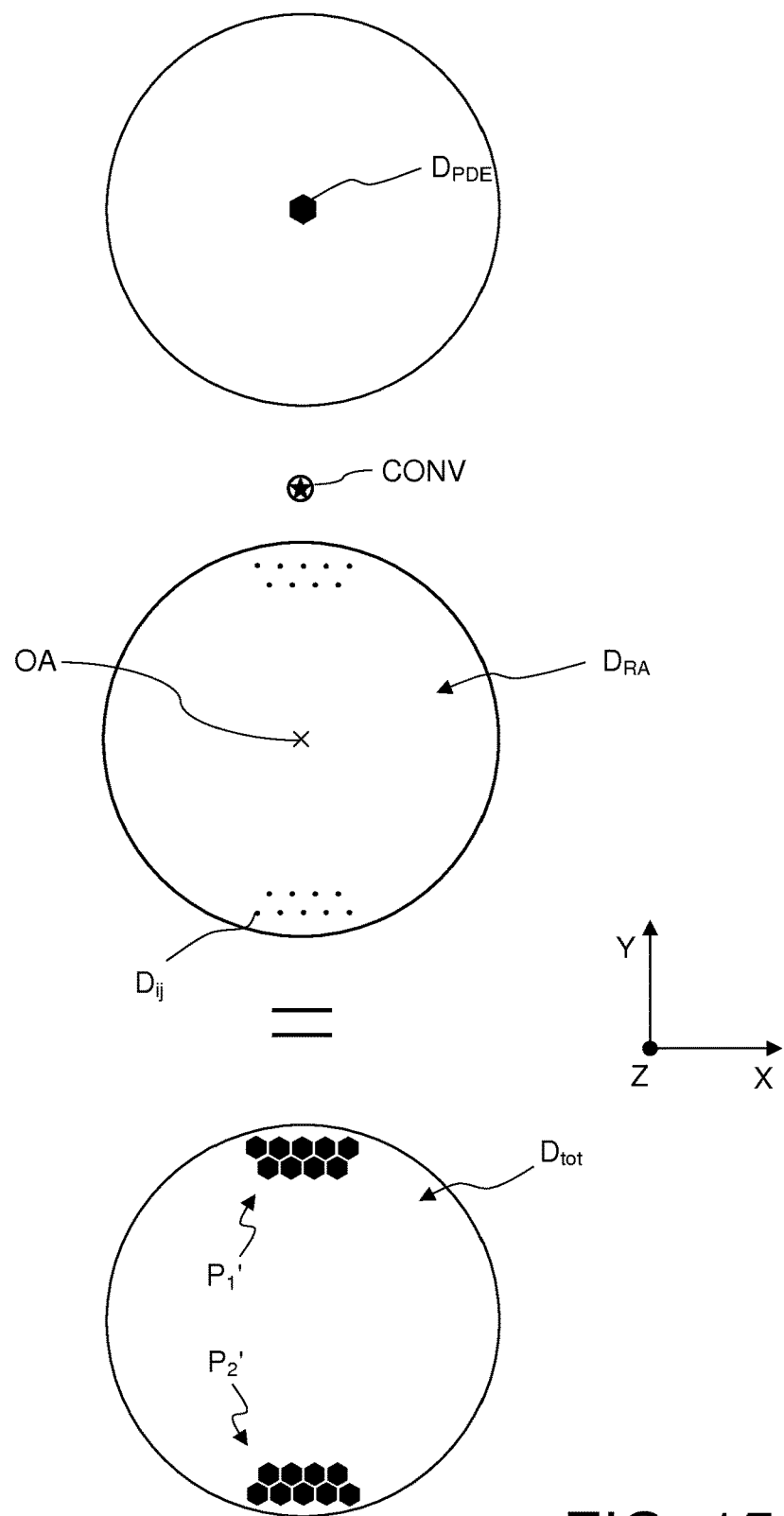
FIG. 15 shows the intensity distribution obtained in the pupil plane of the objective as a result of the convolution of two far field intensity distributions.

This is illustrated in FIG. 15 which shows in its upper portion an exemplary far field intensity distribution $D_{PDE}$ produced by the pupil defining element 493. Here it is assumed that this far field intensity distribution has the shape of a regular hexagon. The central portion of FIG. 15 illustrates an exemplary far field intensity distribution $D_{RA}$ produced by the refractive array 440. The latter is assembled by a plurality of individual far field intensity distributions $D_{ij}$, wherein each individual far field intensity distributions $D_{ij}$ is produced by a single refractive element $T_{ij}$. These individual far field intensity distributions $D_{ij}$ are small spots.

The convolution, which is denoted in FIG. 15 by the symbol CONV, of these two far field intensity distributions $D_{PDE}$ and $D_{RA}$ results in a far field intensity distribution $D_{tot}$ in which a plurality of hexagonal distributions $D_{PDE}$ are assembled according to the point distribution $D_{RA}$. In this exemplary case, this results in two opposite poles $P_1'$, $P_2'$ illuminated in the pupil plane 460. Since the hexagons may be assembled such that no gaps remain in between, the poles $P_1'$, $P_2'$ are more or less continuously illuminated. By changing the deflection angles produced by the refractive elements $T_{ij}$, it is possible to assemble the hexagonal far field intensity distributions $D_{PDE}$ to other geometries, for example poles of different shapes, arranged at different locations, or having different total intensities.

An additional pupil defining element may also be used, as a matter of course, in connection with mirror arrays. Apart from that, the pupil defining element may also be arranged in another field plane. For example, in the exemplary embodiment shown in FIG. 13 the intermediate field plane 391 would be ideally suited for this purpose. Apart from that, it is also possible to provide transparent reflective or refractive elements with diffractive structures that produce the same effect than the pupil defining optical raster element 494.

The above description of embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. A system having an object plane and an image plane, the system comprising:
   a beam deflection array comprising beam deflection elements,
   wherein:
      the beam deflection elements are individually controllable;
      the beam deflection elements are arranged in or in close proximity to the object plane of the system; and
      the system is an illumination system configured so that, during use of the system in a scanning microlithographic projection exposure apparatus:
         a mask is present in the image plane of the system; and
         light emerging from a point in the object plane of the system converges to a conjugated point in the image plane of the system, and
   wherein:
      each beam deflection element has only a first state and a second state; and
      during use of the system in the scanning microlithographic projection exposure apparatus, a light beam deflected from a beam deflection element that is in the first state passes a pupil plane of the system, and a light beam deflected from a beam deflection element that is in the second state does not pass the pupil plane.

2. The system of claim 1, further comprising a raster element in a plane so that, during use of the system in the scanning microlithographic projection exposure apparatus, light emerging from a point in the plane in which the raster element is arranged converges to a conjugated point in the image plane of the system.

3. The system of claim 2, wherein the raster element comprises a microlens array.

4. The system of claim 2, wherein the raster element comprises a diffractive optical element.

5. The system of claim 1, further comprising a field stop.

6. The system of claim 5, wherein the field stop is arranged in an intermediate image plane of the system that is optically conjugated to the object plane of the system.

7. The system of claim 5, wherein:
   a stop edge of the field stop comprises a plurality of blades; and
   at least one of the following holds:
      a shape of at least some of the blades is adjustable via an actuator; and
      a position of at least some of the blades is adjustable via an actuator.

8. The system of claim 1, wherein the beam deflection elements are arranged in a staggered manner so that, during use of the system in the scanning microlithographic projection exposure apparatus, at least one beam deflection element is illuminated on each line which extends parallel to a scan direction of the scanning microlithographic projection exposure apparatus between opposite ends of the beam deflection array.

9. The system of claim 1, wherein at least one of the following hold:
   a) the beam deflection elements are arranged at a distance A with $|A|>A_{min}$ from the object plane of the system, and the distance $A_{min}$ is a shortest distance from the object plane of the system at which a usable field in the object plane of the system is completely illuminated by the beam deflection elements during use of the system in the scanning microlithographic projection exposure apparatus; and
   b) the beam deflection elements are arranged at a distance $A<A_{max}$ from the object plane of the system, and the distance $A_{max}$ is a shortest distance from the object plane of the system at which two light bundles emerging from opposite edges of a beam deflection element intersect during use of the system in the scanning microlithographic projection exposure apparatus.

10. The system of claim 1, wherein the beam deflection elements comprise transparent elements configured so that, during use of the system in the scanning microlithographic projection exposure apparatus, the transparent elements deflect light rays passing through the transparent elements.

11. The system of claim 1, wherein the beam deflection elements comprise mirrors that are tiltable relative to the object plane of the system.

12. The system of claim 11, wherein the mirrors are tiltable about two tilt axes which define an angle therebetween.

13. The system of claim 1, wherein the object plane of the system and the image plane of the system are inclined relative to each other.

14. The system of claim 13, further comprising an objective, wherein:
   the object plane of the system and an object side principal plane of the objective at least substantially intersect along a first straight line; and
   the image plane of the system and an image side principal plane of the objective at least substantially intersect along a second straight line.

15. The system of claim 1, wherein:
   the beam deflection elements comprise a first subset of beam deflection elements and a second subset of beam deflection elements; and the system is configured so that, during use of the system, each beam deflection element in the first subset of beam deflection elements is in the first state and each beam deflection element in the second subset of beam deflection elements is in the second state.

16. A system having an object plane and an image plane, the system comprising:
a beam deflection array comprising beam deflection elements; and
a raster element,
wherein:
the beam deflection elements are individually controllable;
the beam deflection elements are arranged in or in close proximity to the object plane of the system; and
the system is an illumination system configured so that, during use of the system in a scanning microlithographic projection exposure apparatus:
a mask is present in the image plane of the system;
light emerging from a point in a plane in which the raster element is arranged converges to a conjugated point in the image plane of the system; and
light emerging from a point in the object plane of the system converges to a conjugated point in the image plane of the system, and
wherein:
each beam deflection element has only a first state and a second state; and
during use of the system in the scanning microlithographic projection exposure apparatus, a light beam deflected from a beam deflection element that is in the first state passes a pupil plane of the system, and a light beam deflected from a beam deflection element that is in the second state does not pass the pupil plane.

17. The system of claim 16, wherein the raster element comprises an array of microlenses.

18. The system of claim 16, wherein:
each beam deflection element has a first state and a second state; and
during use of the system in the scanning microlithographic projection exposure apparatus, a light beam deflected from the beam deflection array:
passes a pupil plane of the system when the beam deflection elements are in their first state; and
does not pass the pupil plane when the beam deflection elements are in their second state.

19. The system of claim 16, wherein:
the beam deflection elements comprise a first subset of beam deflection elements and a second subset of beam deflection elements; and
the system is configured so that, during use of the system, each beam deflection element in the first subset of beam deflection elements is in the first state and each beam deflection element in the second subset of beam deflection elements is in the second state.

* * * * *

UNITED STATES PATENT AND TRADEMARK OFFICE
CERTIFICATE OF CORRECTION

PATENT NO. : 10,241,416 B2
APPLICATION NO. : 14/657320
DATED : March 26, 2019
INVENTOR(S) : Markus Deguenther and Michael Layh It is certified that error appears in the above-identified patent and that said Letters Patent is hereby corrected as shown below:

In the Specification

Column 2, Line 20, delete "hereabove" and insert -- hereinabove --.

Column 11, Line 24, delete "$C_{j'}$." and insert -- $C_j$. --.

Signed and Sealed this
Fourteenth Day of May, 2019

Andrei Iancu
*Director of the United States Patent and Trademark Office*